United States Patent
Nishiki et al.

[19]

[11] Patent Number: 6,111,620
[45] Date of Patent: *Aug. 29, 2000

[54] ACTIVE MATRIX SUBSTRATE

[75] Inventors: Hirohiko Nishiki, Tenri; Takayuki Shimada, Yamatokoriyama; Atsushi Ban, Kyoto; Naofumi Kondo, Ikoma, all of Japan

[73] Assignee: Sharp Kabushiki Kaisha, Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/704,925

[22] Filed: Aug. 28, 1996

[30] Foreign Application Priority Data

Sep. 6, 1995  [JP]  Japan ..................... 7-229357

[51] Int. Cl.[7] ................. G02F 1/1333; G02F 1/1343; G02F 1/1345; G01R 31/00
[52] U.S. Cl. .................. 349/54; 349/139; 349/143; 349/149; 324/770
[58] Field of Search .............. 349/54, 139, 143, 349/149, 152; 324/770, 537, 500

[56] References Cited

U.S. PATENT DOCUMENTS 5,113,134  5/1992  Plus et al. .................. 324/770
5,473,261  12/1995  Marumoto et al. .................. 349/54
5,532,615  7/1996  Kondo et al. .................. 324/770

FOREIGN PATENT DOCUMENTS

| 58-189615 | 11/1983 | Japan | 349/54 |
| 2-210420 | 8/1990 | Japan | 349/149 |
| 3-237433 | 10/1991 | Japan | 349/54 |
| 5-341312 | 12/1993 | Japan | 349/54 |
| 7-5481 | 1/1995 | Japan . | |

*Primary Examiner*—William L. Sikes
*Assistant Examiner*—Dung Nguyen

[57] ABSTRACT

An active matrix substrate provided with a dielectric substrate, on which a gate wire multi-short-circuit group composed of gate wire multi-short-circuit wires and a data wire multi-short-circuit group composed of gate wire multi-short-circuit wires are formed at either ends of the gate wires and data wires, respectively. The gate wires and gate wire multi-short-circuit wires are connected in such a manner that adjacent gate wires are short-circuited with different gate wire multi-short-circuit wires. It has become possible with the present active matrix substrate to conduct electrical inspections such that can detect leakage defects among the gate wires and those among the data wires, correct the revealed defects, and confirm the corrections easier at a low cost. Moreover, the present active matrix substrate can prevent static electricity in a sufficient manner.

17 Claims, 6 Drawing Sheets

ACTIVE MATRIX SUBSTRATE

FIELD OF THE INVENTION

The present invention relates to an active matrix substrate employed in a liquid crystal display or the like, and more particularly, to an active matrix substrate comprising a dielectric substrate, on which a plurality of gate wires intersect with a plurality of data wires and one pixel driving element is provided to each intersection.

BACKGROUND OF THE INVENTION

A liquid crystal display employing a so-called active matrix substrate is known. The active matrix substrate comprises a substrate, on which a plurality of gate wires intersecting with a plurality of data wires and pixel driving elements are provided.

FIG. 5 shows a schematic structure of a conventional active matrix substrate, which includes a transparent dielectric substrate 30 made of glass or the like. A gate wire group 31 having a plurality of gate wires 31a's and a data wire group 32 having a plurality of data wires 32a's are provided on the dielectric substrate 30 in such a manner that the gate wires 31a's intersect with the data wires 32a's. A display area 33 (encircled by a two-dot chain line) is formed at the center of the dielectric substrate 30 in such a manner to include all the pixel driving elements provided individually at the intersections of the gate wires 31a's and data wires 32a's.

The structure of the display area 33 will be detailed with reference to FIGS. 3(a) and 3(b) of the present invention. FIG. 3(a) is a plan view of a pixel TFT 24, namely, a pixel driving element of one pixel portion. FIG. 3(b) is a cross section taken on line III(b) III(b) of FIG. 3 (a). The pixel TFT 24 is made in the following manner. To begin with, a gate wire 1a made of a Ta (tantalum) thin film or the like is formed on a dielectric substrate 8. Then, a gate insulating film 9 is layered on the dielectric substrate 8, and atop of which an amorphous silicon layer 10 that will be made into a TFT activating layer is formed. Subsequently, the amorphous silicon layer 10 is subject to patterning. Next, a pixel electrode 11 is made out of an ITO (Indium Tin Oxide) film in a region adjacent to the one where the pixel TFT 24 will be formed. Then, a Ta thin film or the like is layered, and a data wire 2a, a source electrode 12, and a drain electrode 13 are made through patterning in such a manner to be connected to the pixel TFT 24.

Incidentally, while assembling a display device, static electricity generated by handling or the like often causes element damages in the active matrix substrate, such as damages to the pixel TFT or the insulating film at the intersections of the gate wires 31a's and data wires 32a's. Thus, it is important for the active matrix substrate to prevent the element damages caused by static electricity.

As shown in FIG. 5, gate wire terminal portions 34's are formed in either end side of the gate wires 31a's, and likewise, data wire terminal portions 35's are formed in either end side of the data wires 32a's in the active matrix substrate. Conventionally, the gate wire terminal portions 34's and the data wire terminal portions 35's are extended to cause a short-circuit with a single ring short-circuit wire 36 provided along the periphery of the dielectric substrate 30 to release the static electricity.

However, the ring short-circuit wire 36 is cut off together with the peripheral portion of the dielectric substrate 30 at a cutting line 37 (denoted by an alternate long and short dash line) before a display module is installed into an assembled display panel, the result of which is illustrated in FIG. 6.

This is done so to conduct various kinds of electrical inspections on the display panel, correct revealed defects, and confirm the corrections before the display module is installed into the assembled display panel, which will be described below.

To be more specific, a simple electrical inspection in the first phase to check a disconnection of the gate wires 31a's and data wires 32a's is carried out while the display panel is assembled by disconnecting the ring short-circuit wire 36 at a portion where a short-circuit is made with the gate wire group 31 and at a portion where a short-circuit is made with the data wire group 32 to input a single signal into each wire.

On the contrary, to conduct a more detailed electrical inspection in the second phase to detect leakage defects among the gate wires and those among the data wires, different signals must be inputted into adjacent gate wires and adjacent data wires, respectively. However, if the dielectric substrate 30 still includes the ring short-circuit wire 36, only a single signal can be inputted respectively into the gate wire group 31 and data wire group 32, thereby disallowing the inspections in the second phase. Further, in case of a TFT-LCD (Liquid Crystal Display) which uses the Cs On Gate method as auxiliary capacity, if a single signal is inputted to the gate wire group 31 to drive the same, the same signal is inputted into adjacent gate wires 31a, thereby making the display almost impossible.

A method called "C conversion" is known as a correcting method of dot defects. In the C conversion, when there occurs leakage between a pixel electrode and a data wire 32a to which the pixel electrode is directly connected, an amount of leakage is increased by a laser beam or the like on purpose that the subject pixel electrode will receive the same signal its neighboring pixel electrodes are receiving to make the defective pixel less noticeable. However, the C conversion can not be adopted to correct leakage between a pixel electrode and a data wire 32a to which the pixel electrode is connected indirectly. Thus, to adopt the C conversion, different signals must be inputted into adjacent data wires 32a to find out which pixel electrode causes leakage with which data wire 32a in advance. In short, the ring short-circuit wire 36 must be cut off.

When correcting defects, especially leakage defects between the gate wire 31a and data wire 32a, it is important to specify the spot of the leakage. However, the dielectric substrate 30 including the ring short-circuit wire 36 allows only a simple electrical inspection, in which a single signal is inputted into the gate wire group 31 and data wire group 32, respectively. Thus, when there is more than one leakage spot, apparent leakage spots outnumber the actual leakage spots. For example, when there are four leakage spots, there are 16 intersections of the gate wires 31a's and data wires 32a's. Therefore, it is by no means easy to specify the actual leakage spots, and the ring short-circuit wire 36 must be cut off to make such spot specification easier.

Further, as shown in FIG. 6, line defects are conventionally corrected by providing sub-wires 38a and 38b to cause a short-circuit with a defective data wire 32a using a laser beam or the like. To confirm whether the line defects are corrected or not, the connection resistance between the sub-wires 38a and 38b is measured by measuring a resistance between sub-wire end portions 39a and 39b. To do so, however, the ring short-circuit wire 36 must be cut off completely.

As has been explained, with the above-structured conventional active matrix substrate, detailed electrical inspections are conducted and the revealed defects are corrected only after the ring short-circuit wire 36 is cut off. However, as previously mentioned, static electricity, which will cause the element damages, is generated during the steps of conducting electrical inspections of the display panel after the ring short-circuit wire 36 is cut off, correcting the revealed defects, transporting the display panel for the following step, and installing a driving module.

In addition, a probe must be applied to each of the terminal portions 34 of the gate wires 31a and the terminal portions 35 of the data wires 32a to detect leakage defects between the gate wires 31a's and data wires 32a's through the electrical inspections, correct the revealed defects, and measure the connection resistance between the sub-wires 38a and 38b to confirm the corrections after the ring short-circuit wire 36 is cut off. Thus, the inspections not only take considerable time and efforts, but also cost too much.

SUMMARY OF THE INVENTION

It is therefore an object of the present invention to provide an active matrix substrate, with which an electrical inspection such that can detect leakage defects among the data wires is conducted to correct the revealed defects and confirm the corrections easily at a low cost, so that the active matrix substrate can prevent static electricity and hence hardly causes element damages.

It is another object of the present invention to provide an active matrix substrate, with which an electrical inspection such that can detect the leakage defects among the gate wires is conducted regardless of a method of the auxiliary capacity that the display panel has adopted, so that the active matrix substrate can prevent static electricity and hence hardly causes element damages.

It is a further object of the present invention to provide an active matrix substrate capable of fulfilling the first and second objects at the same time to prevent static electricity in a secure manner.

To fulfill the above objects, a first active matrix substrate of the present invention is characterized by being provided with:

a dielectric substrate;

a data wire group having a plurality of data wires and a gate wire group having a plurality of gate wires, both of the wire groups being provided on the dielectric substrate in such a manner that the data wires intersect with the gate wires;

pixel driving elements provided at intersections of the gate wires and data wires individually; and a short-circuit wire group provided in either end portion side of the data wire group, the short-circuit wire group having a plurality of short-circuit wires, whereby adjacent date wires are short-circuited with different short-circuit wires.

According to the above arrangement, the short-circuit wire group can effectively prevent element damages caused by static electricity. Also, inputting different signals into the short-circuit wires of the short-circuit wire group individually makes it possible to input different signals into adjacent data wires through the short-circuit wires. Thus, while the static electricity is prevented, (1) electrical inspections such that can detect leakage among the data wires can be conducted, (2) the revealed defects can be corrected through the C conversion in case of the leakage between the pixel electrode and data wires, and (3) the corrections on line defects can be confirmed using the sub-wires.

Moreover, using the short-circuit wire group allows the electrical inspections without applying a probe to the terminal portion of each data wire, thereby reducing the time and costs to conduct the electrical inspections and correct the revealed defects.

A second active matrix substrate is characterized by being provided with:

a dielectric substrate;

a data wire group having a plurality of data wires and a gate wire group having a plurality of gate wires, both of the wire groups being provided on the dielectric substrate in such a manner that the data wires intersect with the gate wires;

pixel driving elements provided at intersections of the gate wires and data wires individually; and a short-circuit wire group provided in either end portion side of the gate wire group, the short-circuit wire group having a plurality of short-circuit wires, whereby adjacent gate wires are short-circuited with different short-circuit wires.

According to the above arrangement, the short-circuit wire group can effectively prevent element damages caused by static electricity. In addition, inputting different signals into the short-circuit wires of the short-circuit wire group individually makes it possible to input different signals into adjacent gate wires through the short-circuit wires. Thus, electrical inspections such that can detect leakage among the gate wires can be conducted while the static electricity is prevented. Moreover, such electrical inspections can be conducted even when the display panel adopts the Cs on Gate method for the auxiliary capacity.

Further, using the short-circuit wire group allows the electrical inspections without applying a probe to the terminal portion of each gate wire, thereby reducing the time and costs to conduct the electrical inspections and correct the revealed defects.

A third active matrix substrate is characterized by being provided with:

a dielectric substrate;

a data wire group having a plurality of data wires and a gate wire group having a plurality of gate wires, said both wire groups being provided on said dielectric substrate in such a manner that said data wires intersect with said gate wires;

pixel driving elements provided at intersections of said gate wires and data wires individually; and a first short-circuit wire group provided in either end portion side of the data wire group, the first short-circuit wire group having a plurality of short-circuit wires, whereby adjacent date wires are short-circuited with different short-circuit wires of the first short-circuit wire group; and a second short-circuit wire group provided in either end portion side of the gate wire group, the second short-circuit wire group having a plurality of short-circuit wires, whereby adjacent gate wires are short-circuited with different short-circuit wires of the second short-circuit wire group.

Since the above arrangement includes both the first and second arrangements, the short-circuit wire groups can effectively prevent element damages caused by static electricity, while at the same time, (1) electrical inspections such that can detect leakage among the data wires and those among gate wires can be conducted, (2) the revealed defects can be corrected, and (3) the corrections can be confirmed regardless of a method of the auxiliary capacity that the display panel has adopted. Moreover, different signals are inputted into adjacent data wires and adjacent gate wires, respectively. Thus, even when there occurs leakage between the data wires and gate wires at more than one spot, the actual leakage spots can be specified easily no matter how many apparent leakage spots there may be. Thus, in case of a display panel using the present active matrix substrate, the short-circuit wire group provided to prevent static electricity is disconnected after the display module is installed. As a result, the element damages caused by static electricity can be prevented not only in the inspection step, but also in the installation step, thereby preventing the element damages of the active matrix substrate in a secure manner.

In addition, like the first and second arrangements, electrical inspections can be conducted without applying the probe to the terminal portion of each gate wire and that of each data wire, thereby reducing the time and costs to conduct the electrical inspections or correct the revealed defects.

DETAILED DESCRIPTION OF THE PREFERRED EMBODIMENTS

The following description will describe an example embodiment of the present invention.

Figure 2:
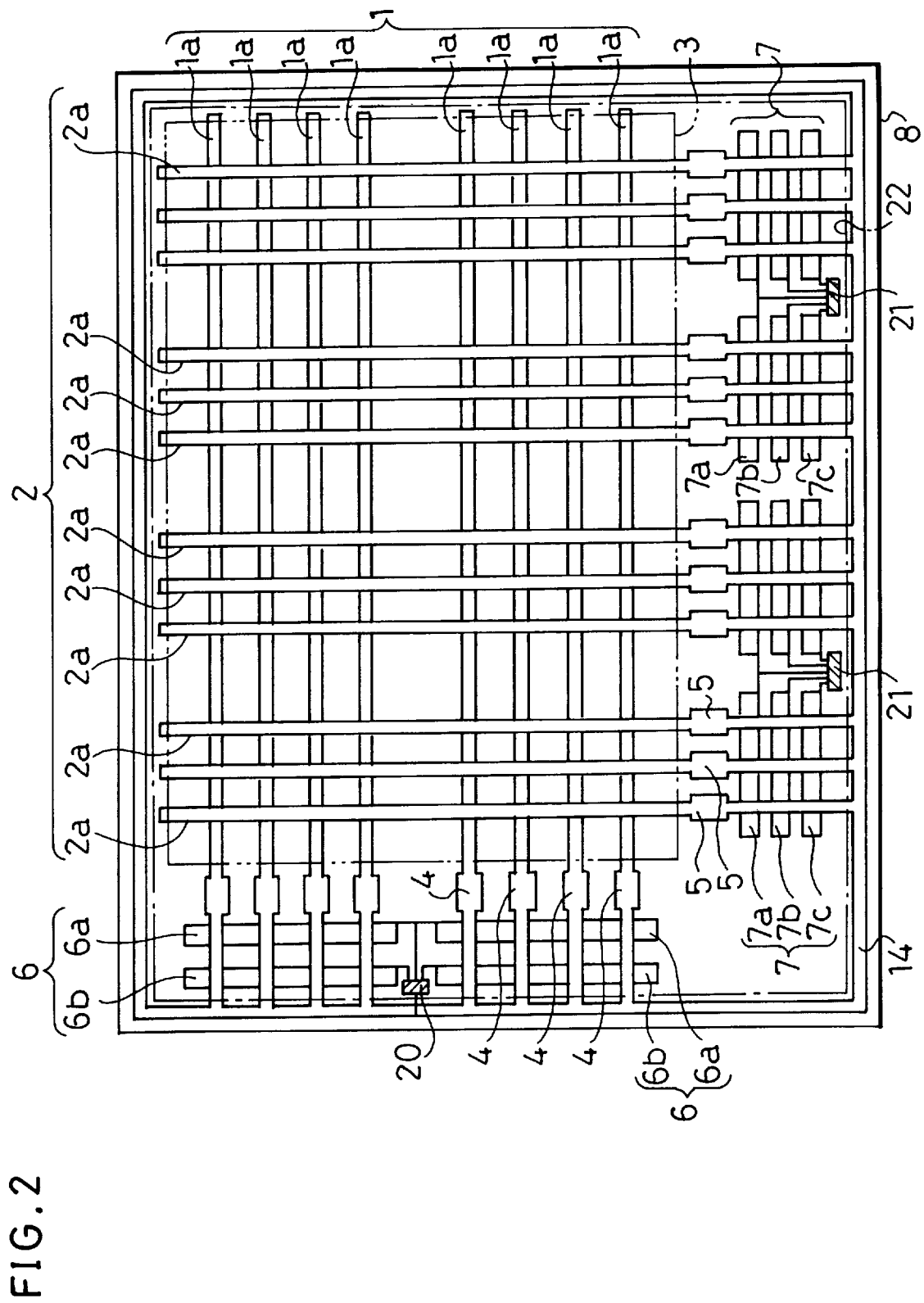
FIG. 2 is a plan view schematically explaining the active matrix substrate.

As shown in FIG. 2, an active matrix substrate of the present embodiment comprises a transparent dielectric substrate 8 made of glass or the like, atop of which a gate wire group 1 having a plurality of gate wires 1a's and a data wire group 2 having a plurality of data wires 2a's are provided in such a manner that the gate wires 1a's intersect with the data wires 2a's. Also, a display area 3 is formed at the center of the dielectric substrate 8 to include all pixel driving elements provided at the intersections of the gate wires 1a's and data wires 2a's individually. A more specific structure of the display area 3 is illustrated in FIGS. 3(a) and 3(b).

Figure 3A:
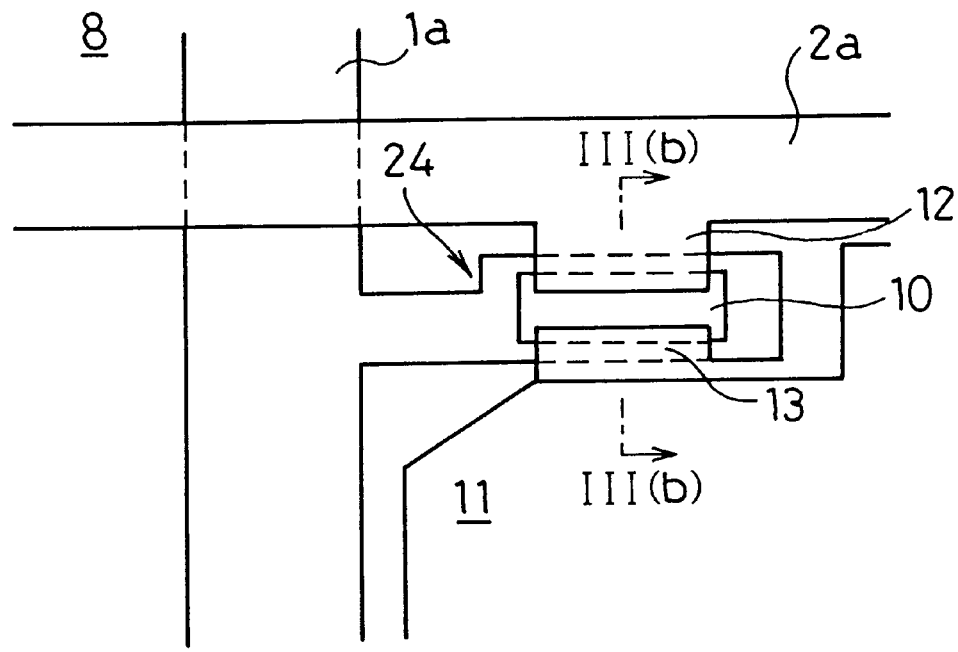
FIG. 3(a) is a plan view showing a pixel driving element provided to each intersection portion of a data wire and a gate wire.
Figure 3B:
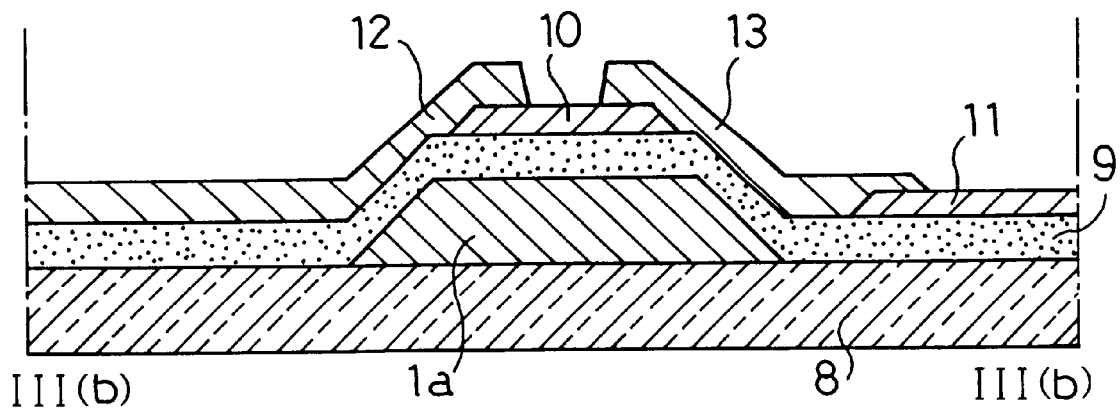
FIG. 3(b) is a cross section taken on line III(b) of FIG. 3(a)

FIG. 3(a) is a plan view of a pixel TFT 24, namely, a pixel driving element of one pixel portion, and FIG. 3(b) is a cross section taken on line III(b) of FIG. 3(a). The pixel TFT 24 is made in the following manner. To begin with, the gate wire 1a is formed on the dielectric substrate 8 out of a Ta (tantalum) thin film or the like, and atop of which a gate insulating film 9 and an amorphous silicon layer 10 that will be made into a TFT activating layer are sequentially formed in this order. Then, the amorphous silicon layer 10 is subject to patterning. Next, a pixel electrode 11 is formed out of an ITO (Indium Tin Oxide) film at a region adjacent to the one where the pixel TFT 24 will be formed. Then, a Ta thin film or the like is layered, and a data wire 2a, a source electrode 12, and a drain electrode 13 are made through patterning in such a manner to be connected to the pixel TFT 24. Note that the insulating film 9 is omitted in FIG. 3(a).

Also, as shown in FIG. 2, a gate wire terminal portion 4 is formed in either end side of each gate wire 1a. Likewise, a data wire terminal portion 5 is formed in either end side of each data wire 2a. Each terminal portion is short-circuited with a single ring short-circuit wire 14 formed along the periphery of the dielectric substrate 8.

In the present active matrix substrate, a gate wire multi-short-circuit wire group 6 and a data wire multi-short-circuit wire group 7 are formed on the dielectric substrate 8 at the inner periphery of the ring short-circuit wire 14. The gate wire group 1 and data wire group 2 are short-circuited respectively with the gate wire multi-short-circuit wire group 6 and data wire multi-short-circuit wire group 7 before they are short-circuited with the ring short-circuit wire 14.

The gate wire multi-short-circuit wire group 6 includes gate wire multi-short-circuit wires 6a and 6b, which extend in a direction to intersect at right angles with the longitudinal direction of the gate wires 1a's. The data wire multi-short-circuit wire group 7 includes data wire multi-short-circuit wires 7a, 7b, and 7c, which extend in a direction to intersect at right angles with the longitudinal direction of the data wires 2a's. Here, each of the gate wire group 1 and data wire group 2 is divided into some blocks depending on the area they are formed, and the gate wire multi-short-circuit wire group 6 and data wire multi-short-circuit wire group 7 are formed in each block.

Figure 1:
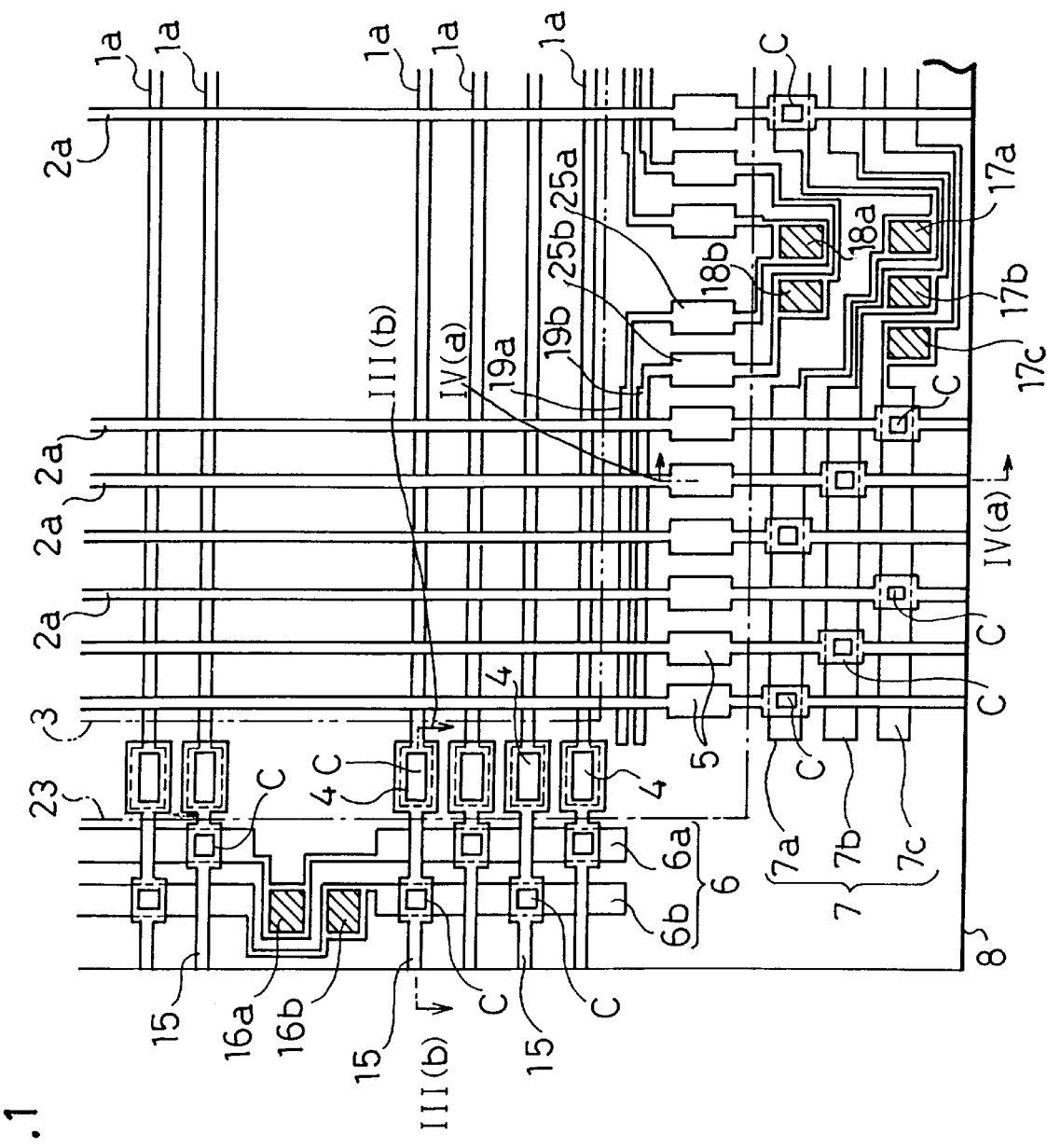
FIG. 1 is a plan view schematically explaining a major portion of an active matrix substrate in accordance with an example embodiment of the present invention.

As is illustrated in an enlarged view of the major portion of FIG. 1, the gate wire group 1 and gate wire multi-short-circuit wire group 6 are connected to each other at contacts C's in such a manner that adjacent gate wires 1a's are short-circuited with the gate wire multi-short-circuit wires 6a and 6b alternately. Likewise, the data wire group 2 and data wire multi-short-circuit wire group 7 are connected to each other at contacts C's in such a manner that adjacent data wires 2a's are short-circuited with different wires out of the data wire multi-short-circuit wires 7a, 7b, and 7c. Note that the stripe arrangement is the precondition of the present active matrix substrate. Thus, every third data wire 2a is connected to the same data wire multi-short-circuit wire 7a, 7b, or 7c.

Figure 4A:
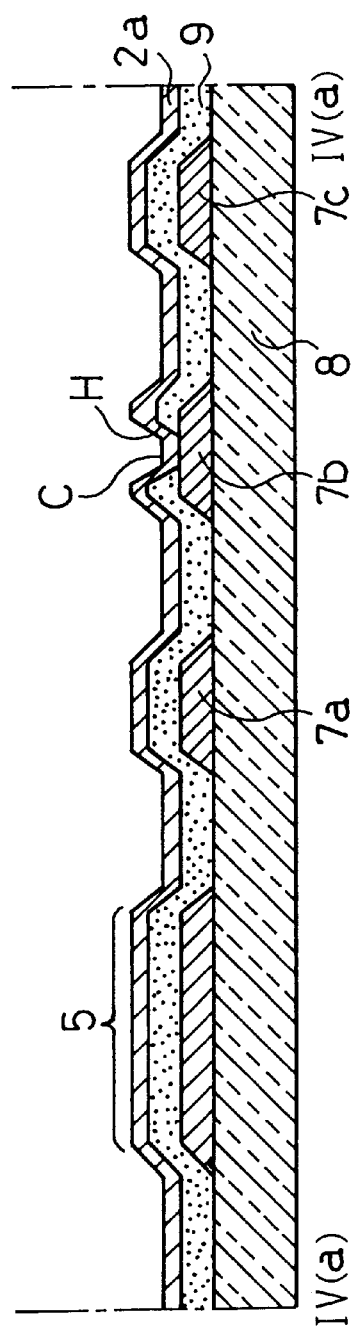
FIG. 4(a) is a cross section taken on line IV(a) of FIG. 1.
Figure 4B:
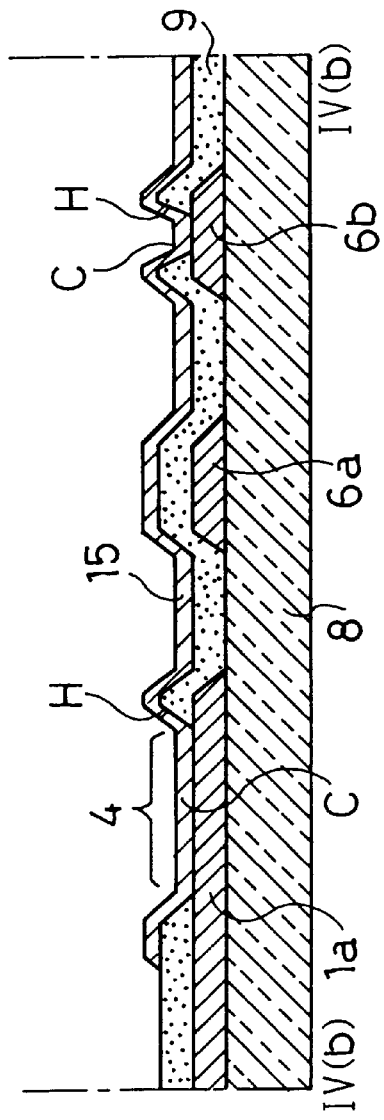
FIG. 4(b) is a cross section taken on line IV(b) of FIG. 1.
Figure 5:
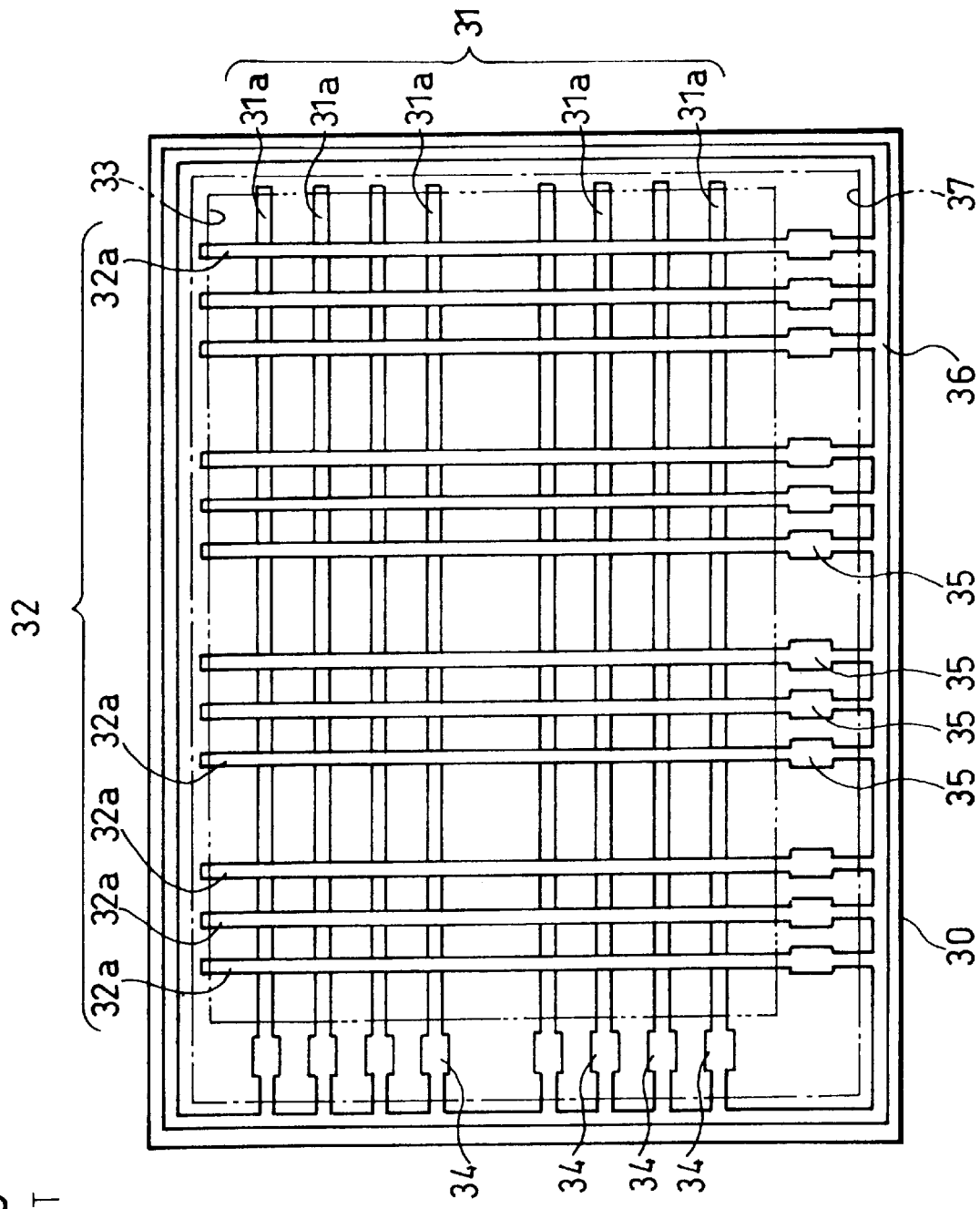
FIG. 5 is a plan view schematically explaining a conventional active matrix substrate.
Figure 6:
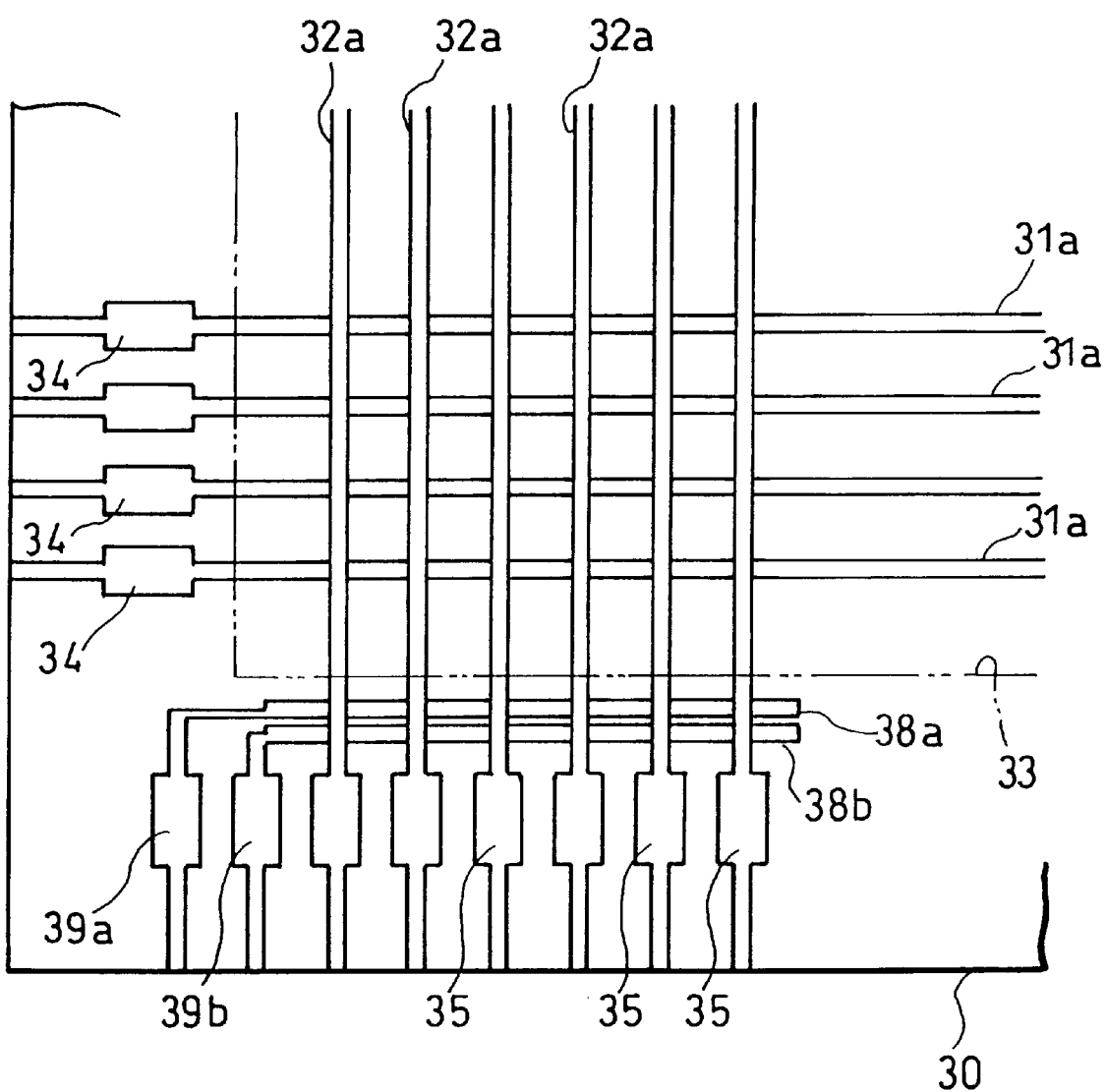
FIG. 6 is a plan view schematically explaining a major portion of the active matrix substrate of FIG. 5.

FIG. 4(a) is a cross section taken on line IV(a) of FIG. 1, and FIG. 4(b) is a cross section taken on line IV(b) of FIG. 1. As shown in FIGS. 4(a) and 4(b), the data wire multi-short-circuit wire group 7 and gate wire multi-short-circuit wire group 6 are formed at the same time when the gate wires 1a's are formed out of the same thin film.

As shown in FIG. 4 (a), one of the data wire multi-short-circuit wires 7a, 7b, and 7c (herein the data wire multi-short-circuit 7b) is electrically connected to the data wire 2a through a contact hole H. To be more specific, the contact hole H is made through in the gate insulating film 9 in advance where the data wire multi-short-circuit wire 7a, 7b, or 7c subject to electrical connection will overlap the data wire 2a, so that electrical contact is established between the subject data wire multi-short-circuit wire 7a, 7b, or 7c and the data wire 2a when the data wire 2a is formed later. Thus, of all the data wire multi-short-circuit wires 7a, 7b and 7c, the one (the data wire multi-short-circuit wire 7b herein) subject to electrical connection makes electrical contact with the data wire 2a at the contact C.

On the other hand, as shown in FIG. 4 (b), the gate wire multi-short-circuit wires 6a and 6b are electrically connected to the gate wires 1*a*'s in the following manner. Two contact holes H's are made through in the insulating film 9 in a region at the gate wire terminal portion 4 (left-hand portion in the drawing) and in a region where one of the gate wire multi-short-circuit wires 6*a* and 6*b* (herein the gate wire multi-short-circuit wire 6*b*) subject to electrical connection overlaps the extended portion of the gate wire 1*a* (right-hand portion in the drawing), respectively. Then, a part of a contact bridge 15 is brought into contact with the gate wire multi-short-circuit wire 6*b* at the contact C in the right-hand portion, while another part of the contact bridge 15 is brought into contact with the gate wire 1*a* at the contact C in the left-hand portion. In this way, the gate wire multi-short-circuit wires 6*a* and 6*b* are electrically connected to the gate wires 1*a*'s, respectively. Note that the contact C represents a region where electrical contact is established through the contact hole H.

The above arrangement makes it possible to form the gate wire multi-short-circuit wire group 6 and data wire multi-short-circuit wire group 7 outside of the periphery of the display area 3. Although the gate wire multi-short-circuit wire group 6 and data wire multi-short-circuit wire group 7 are formed at the same time when the gate wire group 1 is formed in the present embodiment, the gate wire multi-short-circuit wire group 6 and data wire multi-short-circuit wire group 7 may be formed when the data wire group 2 is formed out of the same thin film.

Also, as shown in FIG. 1, each of the gate wire multi-short-circuit wires 6*a* and 6*b* and data wire multi-short-circuit wires 7*a*, 7*b* and 7*c* is designed in such a manner that a signal is inputted into each wire from either side. The gate wire multi-short-circuit wires 6*a* and 6*b* and data wire multi-short-circuit wires 7*a*, 7*b* and 7*c* respectively include inspection pads (inspection input sections) 16*a*, 16*b*, 17*a*, 17*b*, and 17*c* (shaded portions in the drawing) into which an inspection signal is inputted.

Also, the present active matrix substrate includes two sub-wires 19*a* and 19*b* in each block for correcting line defects caused by a defective data wire 2*a*. The sub-wires 19*a* and 19*b* respectively include inspection pads 18*a* and 18*b* (shaded portions in the drawing) for inspecting a connection resistance between the sub-wires 19*a* and 19*b* together with sub-wire terminal portions 25*a* and 25*b*, respectively.

As shown in FIG. 2, in the present active matrix substrate, the inspection pads 16*a* and 16*b* in the side of the gate wires 1*a*'s, and the inspection pads 17*a*, 17*b*, 17*c*, 18*a*, and 18*b* in the side of the data wires 2*a*'s are made into inspection pad units 20 and 21, respectively (shaded portions in the drawing). Further, each of the inspection pad units 20 and 21 is shared by two blocks.

The procedure of the electrical inspections or corrections of the revealed defects with the above-structured active matrix substrate will be explained in the following.

To begin with, a simple electrical inspection is conducted using the ring short-circuit wire 14 of FIG. 2. After the simple electrical inspection, the ring short-circuit wire 14 is cut off from the dielectric substrate 8 at the cutting line 22 indicated by an alternative long and short dash line together with the peripheral portion thereof. The resulting active matrix substrate is illustrated in FIG. 1.

Next, inspection signals are inputted through the gate wire inspection pads 16*a* and 16*b*, and the data wire inspection pads 17*a*, 17*b*, and 17*c*, respectively. Accordingly, different signals are inputted into adjacent gate wires 1*a*'s and adjacent data wires 2*a*'s through the gate wire multi-short-circuit wires 6*a* and 6*b* and the data wire multi-short-circuit wires 7*a*, 7*b*, and 7*c*, respectively. As a result, it has become possible to conduct a detailed electrical inspection such that can detect leakage among the gate wires and the leakage among the data wires, respectively.

In case of leakage between the pixel electrode 11 (FIG. 3 (*a*)) and data wire 2*a*, inspection signals are inputted through the data wire inspection pads 17*a*, 17*b*, and 17*c*, respectively. As a result, different signals are inputted to adjacent data wires 2*a*'s through the data wire multi-short-circuit wires 7*a*, 7*b*, and 7*c*. Then, it is judged whether or not the dot defect is caused by the leakage between a pixel electrode 11 and a data wire 2*a* to which the pixel electrode 11 is directly connected, and whether the defect can be corrected through the aforementioned C conversion or not is checked. When the C conversion is judged to be applicable, the correction is made upon the judgment. Then, it is further judged whether the pixel corrected through the C conversion disappears from the display or appears as a block point.

Also, to correct leakage defects between the gate wire 1*a* and data wire 2*a*, different signals are inputted through the gate wire inspection pads 16*a* and 16*b* and the data wire inspection pads 17*a*, 17*b*, and 17*c*, respectively. Accordingly, different signals are inputted into adjacent gate wires 1*a* and adjacent data wires 2*a* through the gate wire multi-short-circuit wires 6*a* and 6*b* and gate wire multi-short-circuit wires 7*a*, 7*b*, and 7*c*, respectively. As a result, it has become possible to specify the actual leakage spots.

To confirm whether the line defects are corrected or not, the connection resistance between the sub-wires 19*a* and 19*b* is measured using the sub-wire inspection pads 18*a* and 18*b*.

When the detailed electrical inspection and correction of the revealed defects are completed, the gate wire multi-short-circuit wire group 6 and data wire multi-short-circuit wire group 7 are cut off together with the peripheral portion of the dielectric substrate 8 at a second cutting line 23 of FIG. 1 immediately before or after the driving module is installed in the display panel.

As has been explained, with the active matrix substrate of the present embodiment, the gate wire multi-short-circuit wire group 6 having the gate wire multi-short-circuit lines 6*a* and 6*b* and data wire multi-short-circuit wire group 7 having the data wire multi-short-circuit lines 7*a*, 7*b*, and 7*c* are formed on the dielectric substrate 8 at the inner periphery of the ring short-circuit wire 14. The gate wires 1*a*'s are connected to the gate wire multi-short-circuit wires 6*a* and 6*b* in such a manner that adjacent gate wires 1*a*'s are connected to the gate wire multi-short-circuit wires 6*a* and 6*b* alternately. Likewise, the data wires 2*a*'s are connected to the data wire multi-short-circuit wires 7*a*, 7*b*, and 7*c* in such a manner that adjacent data wires 2*a*'s are connected to different wires out of the data wire multi-short-circuit wires 7*a*, 7*b*, and 7*c*.

Consequently, not only the element damages caused by static electricity can be prevented effectively by the gate wire multi-short-circuit wires 6*a* and 6*b* or data wire multi-short-circuit wires 7*a*, 7*b*, and 7*c*, but also the electrical inspections, correction of the revealed defects, and confirmation of the corrections are conducted in the following manner.

To be more specific, inputting different signals respectively into the data wire multi-short-circuit wires 7*a*, 7*b*, and 7*c* makes it possible to input different signals into adjacent data wires 2*a*'s, thereby allowing a detailed electrical inspection such that can detect leakage among the data wires.

Similarly, inputting different signals into the gate wire multi-short-circuit wires 6a and 6b makes it possible to input different signals into adjacent gate wires 1a's, thereby allowing an electrical inspection such that can detect leakage among the gate wires regardless of a method of the auxiliary capacity.

Since different signals are inputted into adjacent data wires 2a's, even when leakage occurs between the pixel electrode 11 and data wire 2a, it is easy now to check which pixel electrode 11 causes leakage with which data wire 2a, and therefore, the defects can be corrected through the aforementioned C conversion. In addition, whether the line defects are corrected or not can be judged using the sub-wires 19a and 19b.

Also, different signals can be inputted respectively into adjacent data wires 2a's and adjacent gate wires 1a's. Thus, when leakage occurs more than one spot between the data wire 2a and gate wire 1a, the actual leakage spots can be specified easily no matter how many apparent leakage spots there may be.

Moreover, the gate wire multi-short-circuit wire group 6 and data wire multi-short-circuit wire group 7 obviate the probe which used to be applied to each terminal portion during the electrical inspection. Thus, the time and costs of the electrical inspections and correction of the revealed defects can be reduced.

In other words, in the conventional electrical inspections, the leakage defects among the gate wires and those among the data wires are detected by applying the probe to each terminal portion. In contrast, adopting the structure of the present active matrix substrate enables the same electrical inspection far easier at a low cost before the short-circuit wires are cut off. As a result, it has become possible to prevent the element damages caused by static electricity generated while electrical inspections are conducted, the revealed defects are corrected, and the display panel is transported for the following step.

It should be particularly noted that the gate wire multi-short-circuit wires 6a and 6b and the data wire multi-short-circuit wires 7a, 7b, and 7c, which are provided to prevent static electricity, are cut off after the driving module is installed. Therefore, the element damages caused by static electricity can be prevented during not only the inspection step, but also the installing step. In short, the element damages caused by static electricity can be prevented in a secure manner.

Also, in case of the present active matrix substrate, a signal is inputted into each of the gate wire multi-short-circuit wire group 6 and the data wire multi-short-circuit wire group 7 from either side. Moreover, the inspection pads 16a, 16b, 17a, 17b, and 17c are shared by two blocks. Thus, the number of the inspection pads can be reduced.

Note that, however, compared with a case where a signal is inputted from both sides, inputting a signal from either side is advantageous in that it can decrease the number of the inspection pads, but at the same time, it has a drawback that an inspection signal is likely to cause latency. In view of the foregoing, the gate wire multi-short-circuit wire group 6 and the data wire multi-short-circuit wire group 7 may be arranged in such a manner to receive a signal from the both sides.

With the present active matrix substrate, each of the inspection pads 16a and 16b in the side of the gate wires 1a's, and the inspection pads 17a, 17b, 17c, 18a, and 18b in the side of the data wires 2a's are made into units, respectively. This arrangement renders compatibility to the probe, a different type of which is conventionally prepared for each model.

Also, with the present active matrix substrate, the gate wire multi-short-circuit wire group 6 and data wire multi-short-circuit wire group 7 are formed in each block, which allows the inspections per block. This arrangement especially improves the work efficiently in specifying the actual leakage spots when there occurs leakage between the gate wire 1a and data wire 2a at more than one spot. In addition, providing the above two wire groups in each block can shorten the latency of a signal depending on the capacity between the data wire multi-short-circuit wire group 7 and data wire group 2.

Also, since the stripe arrangement is the precondition for the present active matrix substrate, every third data wire 2a in the data wire group 2 is short-circuited with the same data wire multi-short-circuit wire 7a, 7b, or 7c. In contrast, when the data wires are grouped by colors, connecting the data wires 2a's to the data wire multi-short-circuit wire of the same color allows a single-color inspection even when the data wires are short-circuited with the data wire multi-short-circuit wires. Note that the above wire groups are not necessarily divided into blocks in this case, that is, in case of the single-color inspection using the data wire multi-short-circuit wires.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An active matrix substrate comprising:

a dielectric substrate;

a data wire group having a plurality of data wires and a gate wire group having a plurality of gate wires, said both wire groups being provided on said dielectric substrate in such a manner that said data wires intersect with said gate wires;

pixel driving elements provided at intersections of said gate wires and data wires individually; and a short-circuit wire group having a plurality of short-circuit wires, said short-circuit wire group being provided in either end portion side of at least one of said wire groups, adjacent wires in said one of said wire groups being short-circuited with different short-circuit wires;

wherein said short-circuit wires include an inspection input section which receives different inspection signals for inputting respectively to the wire groups to which the short circuiting wires are connected to check defective connection among the data and/or the gate wires through application of a voltage.

2. The active matrix substrate as defined in claim 1, wherein said short-circuit wire group is provided in either end portion side of said data wire group, whereby adjacent data wires are short-circuited with different short-circuit wires.

3. The active matrix substrate as defined in claim 1, wherein said short-circuit wire group is provided in either end portion side of said gate wire group, whereby adjacent gate wires are short-circuited with different short-circuit wires.

4. The active matrix substrate as defined in claim 1, wherein, when said short-circuit wire group includes n short-circuit wires, the wires in said one of said wire groups to which said short-circuit wire group is provided are sequentially grouped into a first group, a second group, ..., and n'th group every n wires from a first wire, an i'th (i=1, 2, ..., n) short-circuit wire out of said n short-circuit wires being short-circuited with said i'th data wires.

5. The active matrix substrate as defined in claim 4, wherein said each short-circuit wire extends in a direction to intersect at right angles with a longitudinal direction of the wires of said one of said wire groups to which said short-circuit wire group is provided.

6. The active matrix substrate as defined in claim 1, wherein:

each of said wire groups is divided into a plurality of blocks depending on a position on said active matrix substrate at which said wire group is made; and said inspection input section is shared by some of said blocks.

7. The active matrix substrate as defined in claim 1, wherein said short-circuit wire group includes first and second sub-groups, each said sub-group including a plurality of short-circuit wires, said first sub-group being provided in either end portion side of said data wire group, whereby adjacent data wires are short-circuited with different short-circuit wires of said first sub-group, said second sub-group being provided in either end portion side of said gate wire group, whereby adjacent gate wires are short-circuited with different short-circuit wires of said second sub-group.

8. The active matrix substrate as defined in claim 7, wherein:

when said first sub-group includes $n_d$ short-circuit wires, the data wires in said data wire group are sequentially grouped into a first group, a second group, ..., and $n_d$'th group every $n_d$ wires from a first data wire, an i'th (i=1, 2, ..., n) short-circuit wire out of said $n_d$ short-circuit wires being short-circuited with said i'th data wires; and when said second sub-group includes $n_g$ short-circuit wires, the gate wires in said gate wire group are sequentially grouped into a first group, a second group, ..., and $n_g$'th group every $n_g$ wires from a first gate wire, an j'th (j=1, 2, ..., n) short-circuit wire out of said $n_g$ short-circuit wires being short-circuited with said j'th data gate.

9. The active matrix substrate as defined in claim 1, wherein said inspection input section includes a plurality of inspection pads made into units.

10. An active matrix substrate comprising:

a dielectric substrate;

a data wire group having a plurality of data wires and a gate wire group having a plurality of gate wires, said both wire groups being provided on said dielectric substrate in such a manner that said data wires intersect with said gate wires;

pixel driving elements provided at intersections of said gate wires and data wires individually; and a short-circuit wire group having a plurality of short-circuit wires, said short-circuit wire group being provided in either end portion side of at least one of said wire groups, adjacent wires in said one of said wire groups being short-circuited with different short-circuit wires; and further comprising a ring short-circuit wire portion, connected to both the data and gate wires through said short-circuit wires, for causing all of said wires to short-circuit.

11. An active matrix substrate comprising:

a dielectric substrate;

a data wire group having a plurality of data wires and a gate wire group having a plurality of gate wires, said both wire groups being provided on said dielectric substrate in such a manner that said data wires intersect with said gate wires;

pixel driving elements provided at intersections of said gate wires and data wires individually; and a short-circuit wire group having a plurality of short-circuit wires, said short-circuit wire group being provided in either end portion side of at least one of said wire groups, adjacent wires in said one of said wire groups being short-circuited with different short-circuit wires;

each of said wire groups is divided into a plurality of blocks depending on an area where said each wire group is made; and said short-circuit wire group is provided to each said block.

12. An active matrix substrate comprising:

a dielectric substrate;

a data wire group having a plurality of data wires and a gate wire group having a plurality of gate wires, said both wire groups being provided on said dielectric substrate in such a manner that said data wires intersect with said gate wires;

pixel driving elements provided at intersections of said gate wires and data wires individually; and a short-circuit wire group having a plurality of short-circuit wires, said short-circuit wire group being provided in either end portion side of at least one of said wire groups, adjacent wires in said one of said wire groups being short-circuited with different short-circuit wires; and further comprising an insulating film covering said short-circuit wires, wherein contact holes H are made through said insulating film where said short-circuit wires overlap the data wires and/or the gate wires, whereby electrical contact is established between said short-circuit wires and the wires at said contact holes H.

13. An active matrix substrate comprising:

a dielectric substrate;

a data wire group having a plurality of data wires and a gate wire group having a plurality of gate wires, said both wire groups being provided on said dielectric substrate in such a manner that said data wires intersect with said gate wires;

pixel driving elements provided at intersections of said gate wires and data wires individually; and a short-circuit wire group having a plurality of short-circuit wires, said short-circuit wire group being provided in either end portion side of at least one of said wire groups, adjacent wires in said one of said wire groups being short-circuited with different short-circuit wires; and further comprising an insulating film covering said short-circuit wires and the wires of said one of said wire groups, wherein contact bridges made of a conducting material are formed on said insulating film, contact holes H1 are made through said insulating film where said wires overlap said contact bridges, whereby first electrical contact is established between the wire and said contact bridges at said contact holes H1, contact holes H2 are made through said insulating film where the short-circuit wires overlap said contact bridges, whereby second electric contact is established between the short-circuit wires and said contact bridges at said contact holes H2.

14. An active matrix substrate comprising:

a dielectric substrate;

a data wire group having a plurality of data wires and a gate wire group having a plurality of gate wires, said both wire groups being provided on said dielectric substrate in such a manner that said data wires intersect with said gate wires;

pixel driving elements provided at intersections of said gate wires and data wires individually; and a short-circuit wire group having a plurality of short-circuit wires, said short-circuit wire group being provided only at one end portion of at least one of said wire groups, adjacent wires in said one of said wire groups being short-circuited with different short-circuit wires;

wherein said short-circuit wires include an inspection input section which receives different inspection signals for inputting respectively to the wire groups to which the short circuiting wires are connected to check defective connection among the data and/or the gate wires through application of a voltage.

15. An inspection method for an active matrix substrate comprising the steps of:

providing a dielectric substrate with a data wire group having a plurality of data wires and a gate wire group having a plurality of gate wires, both wire groups being provided on said dielectric substrate so that said data wires intersect with said gate wires;

providing pixel driving electrodes provided at intersections of said gate wires and data wires individually; and inputting different inspection signals to adjacent wire groups, so as to check which pixel electrode causes leakage with which adjacent data wire.

16. The inspection method of claim 15, providing means for inputting different inspection signals to adjacent wire groups so as to check which pixel electrode causes leakage with which adjacent wire.

17. An active matrix substrate comprising:

a dielectric substrate;

a data wire group having a plurality of data wires and a gate wire group having a plurality of gate wires, said both wire groups being provided on said dielectric substrate so the data wires intersect with said gate wires;

pixel driving electrodes provided at intersections of said gate wires and data wires individually; and means for inputting different inspection signals to adjacent wire groups so as to check which pixel electrode causes leakage with which adjacent wire.

* * * * *